United States Patent [19]

Hall et al.

[11] 3,747,032

[45] July 17, 1973

[54] ARRANGEMENT FOR PROVIDING IMPROVED LINEARIZATION OF THE VOLTAGE-FREQUENCY CHARACTERISTIC OF A RESONANT CIRCUIT HAVING A VOLTAGE-VARIABLE CAPACITY DIODE

[75] Inventors: James A. Hall; Harry J. Peppiatt, both of Lynchburg, Va.

[73] Assignee: General Electric Company, Lynchburg, Va.

[22] Filed: Oct. 29, 1971

[21] Appl. No.: 193,885

[52] U.S. Cl. .............................. 333/82 B, 332/30 V

[51] Int. Cl. .............................. H01p 7/04, H03c 3/20

[58] Field of Search .................... 334/15; 331/177 V, 331/136 C; 332/30 V; 334/15; 333/82 B

[56] References Cited

UNITED STATES PATENTS

| | | | |
|---|---|---|---|
| 3,204,198 | 8/1965 | Bachnick | 331/177 V |
| 3,443,247 | 5/1969 | Fjerstad | 331/177 V |
| 3,479,615 | 11/1969 | Garver | 331/36 C |
| 3,601,723 | 8/1971 | Johnson | 334/15 |

OTHER PUBLICATIONS

Grace; M. I., "Varactor–Tuned Avalance Transit–Time Oscillator with Linear Tuning Characteristics" MTT–18, 1–1970, pp. 44–45.

Fairchild, "Application Data Fairchild Silicon Transistors," Fairchild Semiconductor, Mt. View, Cal., 1962, APP–48, 1962, pp. 1–3.

Shelton et al. "Octave Tunable Tunnel Diode Oscillators" Microwave Jr. 9–1962, pp. 192–195.

Cawsey; D., "Design of Wide–Range Varactor–Tuned Microwave Tunnel Diode Oscillators" Proc. IEE (London) Vol. 113, 6–1966, pp. 945–947.

*Primary Examiner*—Rudolph V. Rolinec
*Assistant Examiner*—Wm. H. Punter
*Attorney*—James J. Williams

[57] ABSTRACT

A voltage-variable capacity diode is coupled through a one-third wavelength transmission line to a resonant cavity. The capacity of the diode is varied by a modulating voltage so as to change the resonant frequency of the cavity, and hence the resonant frequency of an oscillator. The transmission line causes the resonant frequency of the cavity to vary more linearly over a relatively wide band as a function of the modulating voltage.

1 Claim, 3 Drawing Figures

ARRANGEMENT FOR PROVIDING IMPROVED LINEARIZATION OF THE VOLTAGE-FREQUENCY CHARACTERISTIC OF A RESONANT CIRCUIT HAVING A VOLTAGE-VARIABLE CAPACITY DIODE

BACKGROUND OF THE INVENTION

Our invention relates to an arrangement for frequency-modulating an oscillator as a function of the voltage applied to a voltage-variable capacity diode, and particularly to such an arrangement for providing a more linear relation between the oscillator frequency and the voltage applied to the voltage-variable capacity diode.

Voltage-variable capacity (VVC) diodes are commonly used for frequency-modulating high-frequency oscillators. Typically, a VVC diode is connected into the frequency-determining circuit of the oscillator, and the diode capacity is varied as a function of the voltage applied to the diode. As the diode capacity varies, the oscillator frequency also varies, but in a relatively complex manner with respect to the modulating voltage. As is known, the capacity of a VVC diode varies as follows:

$$C = K/(V + \phi)^n ,$$

where $K$ is a constant for a given diode, $V$ is the applied voltage, $\phi$ is the diode contact potential, and $n$ is a function of the impurity gradient of the diode PN junction. It is desirable that the exponent n be as large as possible, so that a given change in voltage V brings about as much change in capacity as possible. However, the exponent $n$ is as low as 0.16 for graded junctions and 0.5 for step junctions, but may be as high as 3 or 4 for special junction VVC diodes. However, these special junction VVC diodes are relatively lossy, and hence are useful only up to a few hundred megahertz. Since the frequency of a parallel resonant circuit varies inversely as a function of the square root of the capacity, and if the exponent n of a VVC diode is assumed to be 0.5, the frequency of a parallel resonant circuit using such a diode follows the relation $(V + \phi)^{1/4}$. For low distortion frequency modulation, the resonant frequency of the tuned circuit or cavity should vary linearly over a relatively wide band as a function of the modulating voltage applied to the diode. But typically, as pointed out above, known circuits provide a frequency that varies in a relatively complex way as a function of the applied voltage, mainly because of the fractional exponent $n$.

Accordingly, a general object of our invention is to provide a new and improved VVC diode oscillator circuit.

A more specific object of our invention is to provide a new circuit for coupling a VVC diode to a resonant circuit so that the frequency of the resonant circuit, and hence an oscillator, varies linearly with the voltage applied to the diode.

Another object of our invention is to provide a new circuit for coupling a VVC diode to an oscillator for modulating the oscillator frequency without absorbing an excessive amount of the available oscillator output power.

SUMMARY OF THE INVENTION

Briefly, these and other objects are achieved in accordance with our invention by the use of a transmission line, preferably in the order of one-third wavelength long at the center frequency of the oscillator, to connect a VVC diode to the resonant circuit or cavity of an oscillator. We have found that the frequency of the resonant circuit or cavity varies in a very linear relation with the modulating voltage applied to the diode over a relatively wide band and with relatively low power loss, so that we can provide a low distortion frequency modulated oscillator that has many uses and applications.

BRIEF DESCRIPTION OF THE DRAWING

The subject matter which we regard as our invention is particularly pointed out and distinctly claimed in the Claims. The structure and operation of our invention, together with further objects and advantages, may be better understood from the following description given in connection with the accompanying drawing, in which:

DESCRIPTION OF THE PREFERRED EMBODIMENT

Figures 1, 2:
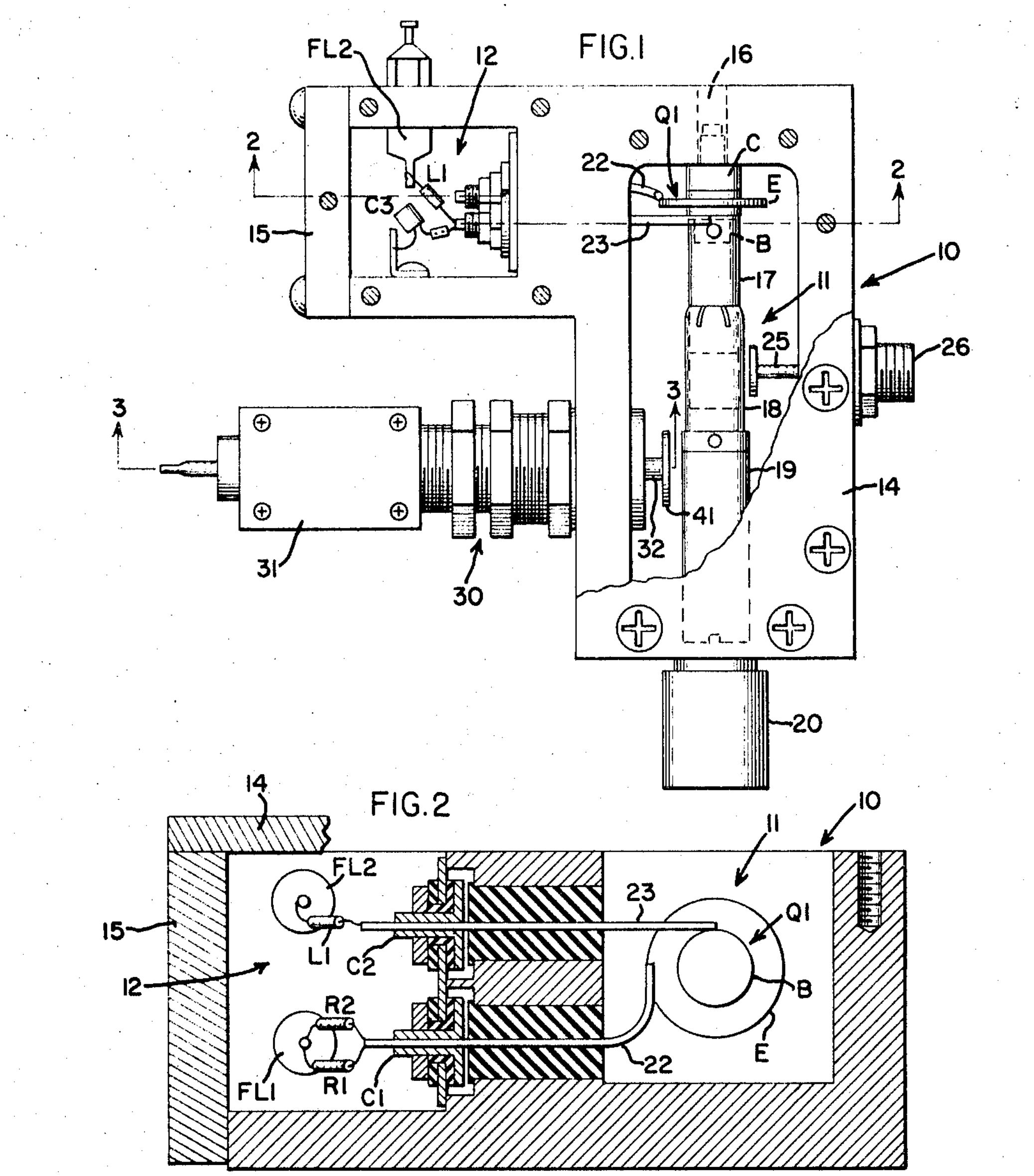
FIG. 1 shows a VVC diode connected to a cavity resonator in accordance with our invention, so that the resonator frequency can be varied linearly with the voltage applied to the diode.
FIG. 2 shows a cross-sectional view of the cavity resonator, taken along the lines 2—2 in FIG. 1.
Figure 3:
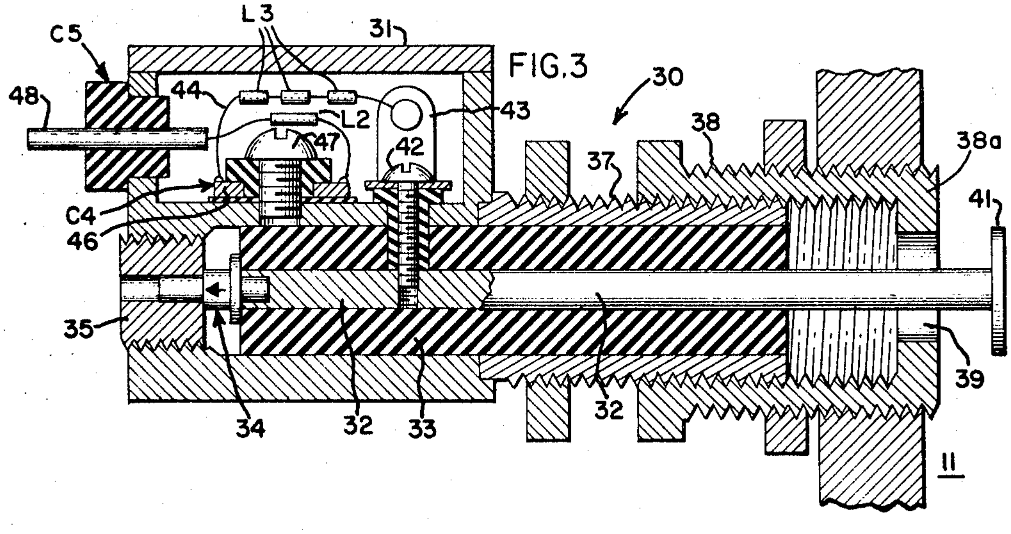
FIG. 3 shows an enlarged cross-sectional view of the diode and its connection to the cavity resonator in accordance with our invention, taken along the lines 3—3 in FIG. 1.

With respect to FIGS. 1, 2, and 3, we have shown an embodiment of our invention used with an oscillator 10 that is provided with a coaxial cavity resonator 11. The cavity resonator 11 is dimensioned to be resonant at a selected center frequency, and this resonant frequency is varied by a modulating voltage or signal as will be explained. The oscillator 10 may be constructed of a generally L-shaped block of metal, such as brass, which is milled or machined to provide the cavity resonator 11 and an input housing 12 for direct current connections. The cavity resonator 11 and the input housing 12 are both closed at their tops by a suitable cover 14 (partially shown in FIGS. 1 and 2), and the housing 12 is closed at its end by a cover 15. The covers 14, 15 are held by machine screws which thread into the walls of the oscillator block. An NPN, bipolar-type transistor (or other electron discharge device) Q1 is positioned in the cavity resonator 11 with its collector C positioned in a hole 16 and connected to wall of the cavity resonator 11. The emitter E and the base B of the transistor Q1 extend into the cavity resonator 11 as shown. An elongated, cylindrical element is attached to the base B to serve as the center conductor for the cavity resonator 11 and to provide means for mechanically changing the resonant frequency of the oscillator 10. This element comprises a fixed, metallic, cylindrical post 17 connected to the base B, and a movable, metallic, cylindrical sleeve 18 which frictionally slides over and engages the fixed post 17. The physical and effective electrical length of the sleeve 18 can be adjusted in any suitable manner, such as a threaded connection (between the post 17 and the sleeve 18) that can be turned by an insulating member 19 attached to the sleeve 18. The member 19 can be provided with a slot for a screw driver, and this slot can be reached through an opening in a wall of the cavity 11. The opening is preferably covered by a metallic shielding cap 20.

As mentioned, the collector C of the transistor Q1 is connected directly to a wall of the cavity resonator 11. The emitter E of the transistor Q1 is supplied with suitable direct current voltage (relative to the wall of the cavity 11) by a quarter wavelength transmission line 22 which passes through a feedthrough capacitor C1 to the housing 12, and through resistors R1, R2 and a feedthrough filter FL1 to an external terminal. Similarly, the base B of the transistor Q1 is supplied with a suitable direct current voltage by a quarter wavelength transmission line 23 which passes through a feedthrough capacitor C2 to the housing 12 through an inductor L1 (bypassed by a capacitor C3), and through a feedthrough filter FL2 to an external terminal. The feedthrough filters FL1, FL2 are known devices which provide a lossy ferrite inductor shunted by a capacitor for isolating radio frequency energy. Output radio frequency energy is derived from the cavity resonator 11 by a probe 25 which is positioned in the resonator 11, and connected through a coaxial connector terminal 26 for connection to an external circuit.

The structure described thus far is known in the art; and, depending upon the voltages supplied and upon the physical dimensions of the cavity resonator 11, the fixed post 17, and the movable sleeve 18, the structure oscillates at some relatively high radio frequency. The high frequency oscillations are derived at the terminal 26 connected to the probe 25.

In order that the frequency of these oscillations can be varied, it is known in the art to use a voltage-variable capacity diode (sometimes called a varactor diode and, in this application, abbreviated VVC diode). As far as we are aware, such diodes have been coupled directly in a cavity resonator, such as the resonator 11, and their apparent capacity varied by a suitable voltage so as to change the resonant frequency of the resonator and hence the output frequency. While such arrangements have worked satisfactorily, we have found that the frequency of oscillation of such a cavity resonator and VVC diode varies in a very non-linear fashion with respect to the voltage applied to the VVC diode. This non-linearity causes distortions of various kinds, particularly if an output that is frequency-modulated over a relatively wide band is to be provided. In accordance with our invention, we have found that if the VVC diode is coupled to such a cavity through a transmission line, the output frequencies vary more nearly linearly with respect to the voltage applied to the VVC diode. Accordingly, we have provided a transmission line 30, which is preferably coaxial and somewhat less than a half wavelength long at the center frequency of oscillation of the cavity resonator 11, in order to couple the VVC diode to the center conductor post 17 and sleeve 18 in the cavity resonator 11. A more exact length for the transmission line 30 can be calculated on the basis of the components being used and known transmission line equations, after which some further experimentation (or computer calculations) for greater linearity may be desirable or necessary. Generally, we have found that a line which is about one-third of a wavelength at the center frequency provides good results. FIG. 1 shows an external view of the transmission line 30 and a housing 31 for the VVC diode, and FIG. 3 shows a cross-sectional view of the line 30 and the housing 31 in accordance with a preferred embodiment of our invention. The housing 31 is a generally rectangular configuration constructed of suitable metal, such as brass. One end of the housing 31 is provided with a cylindrical opening in which the inner conductor 32 of the transmission line 30 is positioned. The conductor 32 may be a cylindrical rod that is insulated from the metal in the housing 31 by an insulating sleeve 33. A recess or opening is provided in the end of the conductor 32 which is located in the housing 31 so as to receive the anode terminal of a VVC diode 34, and hold the diode 34 in position. The cathode terminal of the diode 34 is connected to the housing 31 by a plug 35 which threads into a hole in the housing 31. The other end of the conductor 32 and the insulating sleeve 33 extend through a first externally threaded metallic sleeve 37, and through a second internally and externally threaded metallic sleeve 38. The conductor 32 continues through an opening 39 in the second sleeve 38, and then terminates in a suitable capacitive disk or probe 41. The second sleeve 38 is provided with a flange 38a around the opening 39 to provide metal area in the vicinity of the disk 41. This second sleeve 38 is threaded into a wall of the cavity resonator 11, and may be threaded in and out so as to vary the spacing, and hence the capacitive coupling, between the disk 41 and the flange 38*a*. The first sleeve 37 is rigidly attached to the housing 31. When this sleeve 37 is threaded into or out of the sleeve 38, the inner conductor 32 and the disk 41 move into or out of the resonator 11 to vary the capacitive coupling between the disk 41 and the center conductor post 17 and the sleeve 18. Lock nuts may be provided on the sleeves 37, 38 to hold the sleeves 37, 38 in the desired position. The length of the conductor 32 between the VVC diode 34 and the disk 41 is approximately one-third of a wavelength long (determined by computer design) at the center frequency at which the oscillator 10 is to operate.

From an electrical standpoint, the VVC diode 34 has its anode connected to the conductor 32, which is insulated and capacitively coupled to the cavity 11 through the disk 41, and has its cathode connected to the metallic housing 31, the sleeves 37, 38, and the wall of the cavity resonator 11. If a reverse bias voltage is applied between the anode and cathode of this diode 34, the capacity or capacitive reactance presented to the inner coaxial conductor in the cavity resonator 11 can be varied as a function of this voltage. Since this capacity determines the resonant frequency of the cavity resonator 11, the frequency of the oscillator 10 can be modulated as a function of the applied voltage. The modulating voltage is supplied between the conductor 32 and the metal forming the housing 31. An external connection to the conductor 32 is provided by a machine screw 42 and a terminal 43. The screw 42 is threaded into the conductor 32, but the screw 42 and the terminal 43 are otherwise insulated as shown. The terminal 43 is connected by a conductor 44, which may be provided with inductive beads L3, to a metal plate 46 which is separated from the metal forming the housing 31 by a small layer of insulation to form a bypass capacitor C4. The metal plate 46 is held by a machine screw 47 which is insulated from the plate 46. The metal plate 46 is connected through a lumped inductor L2 which, in turn, is connected to an insulated terminal 48. Thus, there is a direct current connection from the terminal 48, through the inductor L2, through the plate 46, through the conductor 44, through the terminal 43, and through the screw 42 to the conductor 32. A by-pass capacitor C5 is also provided around the terminal 48, as well as by the insulation beneath the plate 46. A direct current voltage is applied between the terminal 48 and the metal forming the housing 31 'o reverse-bias the VVC diode 34. Variations in this voltage vary the capacity of the VVC diode 34 and hence the capacitive loading presented by the disk 41 to the inner coaxial conductor (the post 17 and the sleeve 18) of the cavity resonator 11. We have found that this capacity changes with respect to voltage so that the resonant frequency of the cavity resonator 11 varies in very linear fashion with respect to the applied voltage. Hence, less distorted frequency modulation may be provided in such an oscillator.

Oscillators have been constructed in accordance with the arrangement shown in FIGS. 1, 2 and 3, and have been operated satisfactorily at various frequencies. Specifically, such oscillators have been constructed with center frequencies between 280 and 2,000 megahertz. A commercially manufactured oscillator was built using a TA7943 transistor. A MV1863 VVC diode was coupled to the cavity resonator over a coaxial transmission line that was approximately one-third wavelength long at a center oscillator frequency of 1,700 megahertz. This frequency was obtained with a back bias of 21 volts applied to the VVC diode. When this voltage was varied between 14.94 and 27.06 volts, the oscillator frequency varied between 1,695 and 1,705 megahertz, and the measured deviation from linearity was less than 0.2 percent. These results agree very closely with theoretical calculations made on similar designs. Persons skilled in the art will appreciate that such a linear operation over such a wide frequency band provides many opportunities for frequency-modulated oscillators and other devices which must be very linear in operation.

It will thus be seen that we have provided a new arrangement for providing improved voltage-frequency linearity of a VVC diode coupled to a resonant circuit or to an oscillator. While we have discussed only one embodiment of our invention, it will be appreciated that our invention may be used in many forms. For example, other types of transmission lines, such as lumped circuit equivalents, may be used. The length of the the transmission line coupling the VVC diode to the resonant circuit or cavity may be fixed or variable. The filtering provided by the inductors and capacitors in the housing 31 may not be necessary in some applications. Also, the sleeve 38 which varies the capacity of the disk 41 to ground may not be necessary. Therefore, while our invention has been described with reference to a particular embodiment, it is to be understood that modifications may be made without departing from the spirit of the invention or from the scope of the claims.

We claim:

1. An improved, more linear frequency modulator circuit for a high frequency oscillator having a structure forming a cavity and a transistor operatively positioned in said cavity for causing high frequency oscillations therein, said frequency modulator comprising:

a. a modulator housing attached to said oscillator structure, said modulator housing having an elongated cylindrical opening therein that extends through a part of said oscillator structure to operatively connect with said oscillator cavity;

b. an elongated conductor coaxially positioned in said cylindrical opening and insulatingly supported therein with one end of said elongated conductor positioned in said oscillator cavity and with the other end of said elongated conductor positioned adjacent its respective end of said cylindrical opening, said elongated conductor having a length that is substantially one-third wavelength long at the frequency of oscillations of said oscillator;

c. a probe connected to said one end of said elongated conductor for coupling said elongated conductor to oscillatory energy in said oscillator cavity;

d. a voltage-variable capacity diode mounted on said other end of said elongated conductor;

e. means for connecting one electrode of said voltage-variable capacity diode to said other end of said elongated conductor and the other electrode of said voltage-variable capacity diode to said respective end of said cylindrical opening;

f. and a direct current circuit connected to said elongated conductor between its ends and to said modulator housing for applying a modulating signal to said voltage-variable capacity diode, thereby modulating the frequency of said cavity oscillations in a more linear manner.

* * * * *